United States Patent
Teng et al.

(10) Patent No.: US 9,651,626 B2
(45) Date of Patent: May 16, 2017

(54) ELECTRIC CAPACITY MEASUREMENT APPARATUS WITH TEMPERATURE COMPENSATION AND TEMPERATURE COMPENSATION METHOD THEREOF

(71) Applicant: uPI Semiconductor Corp., Hsinchu County (TW)

(72) Inventors: Kuo-Liang Teng, Hsinchu County (TW); Jih-Liang Juang, Hsinchu County (TW)

(73) Assignee: uPI Semiconductor Corp., Hsinchu County (TW)

( * ) Notice: Subject to any disclaimer, the term of this patent is extended or adjusted under 35 U.S.C. 154(b) by 175 days.

(21) Appl. No.: 14/741,478

(22) Filed: Jun. 17, 2015

(65) Prior Publication Data
US 2016/0146897 A1 May 26, 2016

(30) Foreign Application Priority Data
Nov. 20, 2014 (TW) .............................. 103140241 A

(51) Int. Cl.
*G01N 27/416* (2006.01)
*G01R 31/36* (2006.01)

(52) U.S. Cl.
CPC ..... *G01R 31/3675* (2013.01); *G01R 31/3634* (2013.01)

(58) Field of Classification Search
CPC .................................................. G01R 31/3648
(Continued)

(56) References Cited

U.S. PATENT DOCUMENTS 5,619,430 A 4/1997 Nolan et al.
5,945,853 A * 8/1999 Sano ........................ G01R 1/30
327/307
(Continued)

FOREIGN PATENT DOCUMENTS

CN 102832665 12/2012
TW I262678 9/2006
(Continued)

OTHER PUBLICATIONS

"Office Action of Taiwan Counterpart Application", issued on Jun. 8, 2016, p. 1-p. 4.

*Primary Examiner* — Yalkew Fantu
(74) *Attorney, Agent, or Firm* — Jianq Chyun IP Office

(57) ABSTRACT

An electric capacity measurement apparatus with temperature compensation and a temperature compensation method thereof are provided. The electric capacity measurement apparatus includes an electric capacity measurement circuit, a non-volatile memory, a temperature measurement circuit and a control circuit. The electric capacity measurement circuit is configured to obtain an input current signal and compensate the input current signal according to a present invalid current range or a present zero current offset to obtain an electric capacity signal. The non-volatile memory is configured to store a plurality of test parameters at different temperatures related to the electric capacity measurement circuit in a test stage. The temperature measurement circuit measures a present temperature value of the electric capacity measurement circuit in an operation stage. The control circuit generates a present invalid current range or a present zero current offset according to the present temperature value and the plurality of test parameters.

24 Claims, 4 Drawing Sheets

(58) Field of Classification Search
USPC .......................................................... 324/428
See application file for complete search history.

(56) References Cited

U.S. PATENT DOCUMENTS

| | | | | |
|---|---|---|---|---|
| 6,061,639 | A * | 5/2000 | Wistrand | ........... G01R 31/3624 |
| | | | | 324/427 |
| 6,107,779 | A * | 8/2000 | Hara | .................. G01R 31/3613 |
| | | | | 320/132 |
| 6,958,590 | B1 * | 10/2005 | Vaananen | ............. H01M 10/46 |
| | | | | 320/150 |
| 8,305,070 | B2 * | 11/2012 | Vulih | .................. H02M 3/1584 |
| | | | | 323/282 |
| 8,306,771 | B2 | 11/2012 | Houldsworth | |
| 2001/0040443 | A1 | 11/2001 | Suzuki et al. | |
| 2007/0145954 | A1 * | 6/2007 | Kawahara | ........... B60L 11/1864 |
| | | | | 320/150 |
| 2009/0121726 | A1 * | 5/2009 | Hashimoto | ...... G01R 31/31721 |
| | | | | 324/537 |
| 2011/0125434 | A1 | 5/2011 | Shen et al. | |

FOREIGN PATENT DOCUMENTS

| | | |
|---|---|---|
| TW | I333289 | 11/2010 |
| TW | I345707 | 7/2011 |

* cited by examiner

ELECTRIC CAPACITY MEASUREMENT APPARATUS WITH TEMPERATURE COMPENSATION AND TEMPERATURE COMPENSATION METHOD THEREOF

CROSS-REFERENCE TO RELATED APPLICATION

This application claims the priority benefit of Taiwan application serial no. 103140241, filed on Nov. 20, 2014. The entirety of the above-mentioned patent application is hereby incorporated by reference herein and made a part of this specification.

BACKGROUND

Technical Field

The invention relates to an electric capacity measurement apparatus, and particularly relates to an electric capacity measurement apparatus with temperature compensation and a temperature compensation method thereof.

Related Art

By performing an integral (accumulation) operation on a current flowing into/out of a battery, a coulomb counter can be used to measure an electric capacity of the battery. Generally, settings of the coulomb counter have to be adjusted according to different applications, where one setting is an invalid current range, and another setting is a zero current offset.

Further, a main purpose of setting the invalid current range of the coulomb counter is to filter tiny noises measured by the coulomb counter around a zero current. In other words, when a current value measured by the coulomb counter is smaller than the invalid current range, the coulomb counter takes the current value as the zero current. If the coulomb counter cannot accurately filter such tiny noise, it may cause a measurement error after a long time accumulation.

On the other hand, a user can calibrate the coulomb counter according to the zero current offset of the coulomb counter to eliminate a deviation of current measurement. If the offset is not correctly set, the current measured by the coulomb counter may have a deviation amount. Similarly, after a long time measurement, the coulomb counter generates an error.

The above two settings are generally adjusted through one set of parameters according to different applications. However, under different environment temperatures, characteristics of the coulomb counter are accordingly changed. In other words, the invalid current range and the zero current offset of the coulomb counter are also changed along with temperature variation. If the invalid current range and the zero current offset of the coulomb counter cannot be dynamically adjusted along with the temperature variation, the coulomb counter may generate an error.

SUMMARY

Accordingly, the invention is directed to an electric capacity measurement apparatus with temperature compensation and a temperature compensation method thereof, by which an error of the electric capacity measurement apparatus generated due to temperature variation is decreased.

The invention provides an electric capacity measurement apparatus with temperature compensation including an electric capacity measurement circuit, a non-volatile memory, a temperature measurement circuit and a control circuit. The electric capacity measurement circuit is configured to obtain an input current signal and compensate the input current signal according to a present invalid current range or a present zero current offset to obtain an electric capacity signal. The non-volatile memory is configured to store a plurality of test parameters related to the electric capacity measurement circuit under different temperatures in a test stage. The temperature measurement circuit measures a present temperature of the electric capacity measurement circuit in an operation stage to generate a present temperature value. The control circuit is coupled to the electric capacity measurement circuit, the temperature measurement circuit and the non-volatile memory. The control circuit generates the present invalid current range or the present zero current offset according to the present temperature value and the test parameters for providing to the electric capacity measurement circuit.

The invention provides a temperature compensation method of an electric capacity measurement apparatus, which includes following steps. A plurality of test parameters related to an electric capacity measurement circuit of the electric capacity measurement apparatus under different temperatures are provided. A present temperature value of the electric capacity measurement circuit is measured in an operation stage. A present invalid current range or a present zero current offset of the electric capacity measurement circuit is calculated according to the present temperature value and the test parameters. An input current signal of the electric capacity measurement circuit is compensated according to the present invalid current range or the present zero current offset to obtain an electric capacity signal.

According to the above descriptions, the electric capacity measurement apparatus of the invention obtains the invalid current range or the zero current offset of the electric capacity measurement circuit under the present temperature according to the test parameters stored in the non-volatile memory by using a table look-up method, a polynomial regression operation or other operation modes. In other words, the present invalid current range or the present zero current offset of the electric capacity measurement circuit can be dynamically adjusted according to a temperature variation. Therefore, the error of the electric capacity measurement circuit generated due to temperature variation is decreased, and the minimum current that can be measured by the electric capacity measurement circuit and a current accuracy thereof are ameliorated under different temperatures.

In order to make the aforementioned and other features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION OF DISCLOSED EMBODIMENTS

Figure 1:
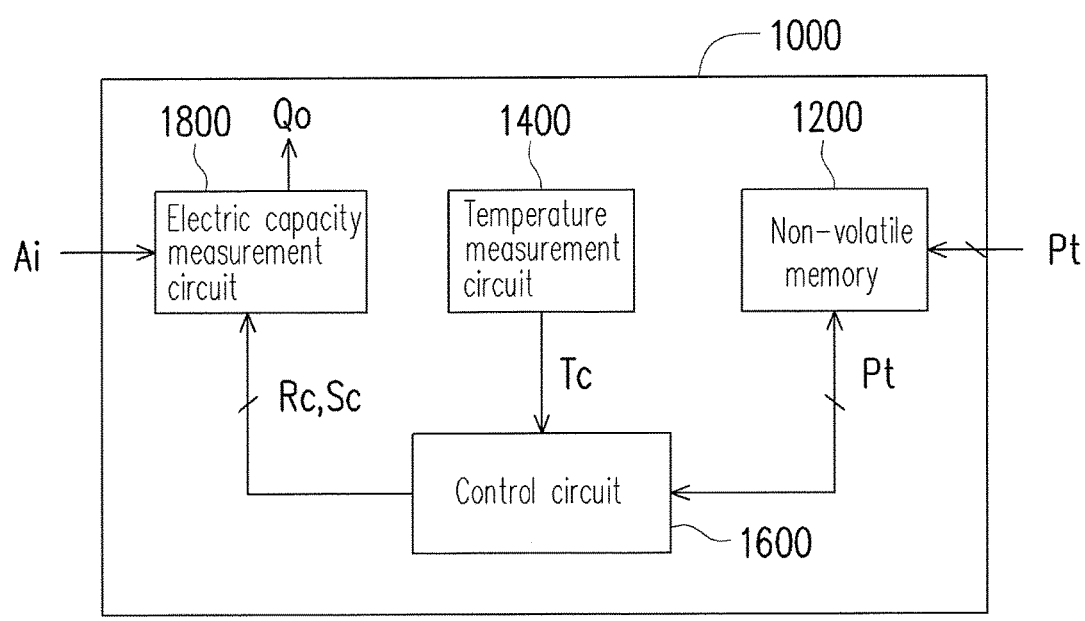
FIG. 1 is a block schematic diagram of an electric capacity measurement apparatus with temperature compensation according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Referring to FIG. 1, FIG. 1 is a block schematic diagram of an electric capacity measurement apparatus 1000 with temperature compensation according to an embodiment of the invention. The electric capacity measurement apparatus 1000 includes a non-volatile memory 1200, a temperature measurement circuit 1400, a control circuit 1600 and an electric capacity measurement circuit 1800. The electric capacity measurement apparatus 1000 is described in detail below.

The electric capacity measurement circuit 1800 is configured to obtain an input current signal Ai. The electric capacity measurement circuit 1800 compensate the input current signal Ai according to a present invalid current range Re or a present zero current offset Sc to obtain an electric capacity signal Qo. The non-volatile memory 1200 is configured to store a plurality of test parameters Pt related to the electric capacity measurement circuit 1800 under different temperatures in a test stage.

The temperature measurement circuit 1400 measures a present temperature of the electric capacity measurement circuit 1800 in an operation stage to generate a present temperature value Tc. The control circuit 1600 is coupled to the electric capacity measurement circuit 1800, the temperature measurement circuit 1400 and the non-volatile memory 1200. The control circuit 1600 generates an invalid current range (i.e., the present invalid current range Rc) or a zero current offset (i.e., the present zero current offset Sc) under the present temperature according to the present temperature value Tc and the test parameters Pt. The control circuit 1600 provides the present invalid current range Rc and the present zero current offset Sc to the electric capacity measurement circuit 1800.

In the present embodiment of the invention, the electric capacity measurement circuit 1800 can be a coulomb counter, the non-volatile memory 1200 can be a flash memory or a read-only memory (ROM), the control circuit 1600 can be a micro-controller or a micro-processor, and the temperature measurement circuit 1400 can be a temperature sensor, though the invention is not limited thereto.

It should be noticed that the test parameters Pt can be obtained by performing different temperature tests to the electric capacity measurement circuit 1800, and the test parameters Pt are stored in the non-volatile memory 1200. The test parameters Pt are described in detail below.

The test parameters Pt may include a plurality of test temperature values and a plurality of test zero current offsets or a plurality of test invalid current ranges corresponding to the test temperature values, as shown in a following table 1. The table 1 lists invalid current ranges (i.e., the test invalid current ranges) and zero current offsets (i.e., the test zero current offsets) obtained by measuring the electric capacity measurement circuit 1800 under different test temperatures. For example, in the table 1, when the test temperature is 75° C., the corresponding test invalid current range is ±18 mA, and the corresponding test zero current offset is 4 mA. The test parameters Pt listed in the table 1 can be obtained by measuring the electric capacity measurement circuit 1800 under different test temperatures through an external test platform (not shown). The external test platform can directly store the test parameters Pt to the non-volatile memory 1200. However, the invention is not limited thereto, and in other embodiments of the invention, the external test platform can also store the test parameters Pt to the non-volatile memory 1200 through the control circuit 1600.

It should be noticed that in the table 1, the test temperature values, the test invalid current range values and the test zero current offset values are only examples, which are not used for limiting the invention. Namely, selection of the test temperature value and an interval between two adjacent test temperatures can be determined according to an actual design and application requirement. Embodiments are provided below to describe the operation of the control circuit 1600.

TABLE 1

| Test temperature (° C.) | Test invalid current range (mA) | Test zero current offset (mA) |
| --- | --- | --- |
| 5 | ±11 | 11 |
| 15 | ±12 | 10 |
| 25 | ±13 | 9 |
| 35 | ±14 | 8 |
| 45 | ±15 | 7 |
| 55 | ±16 | 6 |
| 65 | ±17 | 5 |
| 75 | ±18 | 4 |

In an embodiment of the invention, the data (i.e., the test parameters Pt) listed in the table 1 can be stored in the non-volatile memory 1200 of FIG. 1. The control circuit 1600 of FIG. 1 can obtain the test zero current offset or the test invalid current range corresponding to the present temperature value Tc according to the test parameters Pt stored in the non-volatile memory 1200. The control circuit 1600 can respectively take the test zero current offset or the test invalid current range corresponding to the present temperature value Tc as the present zero current offset Sc or the present invalid current range Rc.

For example, when the temperature measurement circuit 1400 measures that the present temperature value Tc is 45° C., the control circuit 1600 can find the corresponding test invalid current range of ±15 mA or the corresponding test zero current offset of 7 mA from the non-volatile memory 1200 through a table look-up manner. In this way, the control circuit 1600 can set the present invalid current range Rc to ±15 mA or set the present zero current offset Sc to 7 mA. Then, the electric capacity measurement circuit 1800 can compensate the input current signal Ai according to the present invalid current range Rc (i.e., ±15 mA) or the present zero current offset Sc (i.e., 7 mA) to generate the electric capacity signal Qo. A detailed operation of the electric capacity measurement circuit 1800 is described later.

It should be noticed that since the present invalid current range Rc or the present zero current offset Sc of the electric capacity measurement circuit 1800 of the present embodiment can be dynamically adjusted according to a temperature variation, an error of the electric capacity measurement circuit 1800 is decreased. For example, when the temperature of the electric capacity measurement circuit 1800 is increased from 25° C. to 45° C., if the present invalid current range Rc or the present zero current offset Sc of the electric capacity measurement circuit 1800 cannot be accordingly adjusted, the present invalid current range Rc of the electric capacity measurement circuit 1800 may have an error of 13.3% (i.e., (|13−15|)÷15×100%), and the present zero current offset Sc of the electric capacity measurement circuit 1800 may have an error of 28.5% (i.e., (|9−7|)÷7×100%).

On the other hand, the present temperature value Tc measured by the temperature measurement circuit 1400 is probably not included in the table 1. In this case, the control circuit 1600 can also obtain a zero current offset or an invalid current range corresponding to the other present temperature value that is not included in the table 1 through interpolation, though the invention is not limited thereto. For example, when the present temperature value Tc is 40° C., the control circuit 1600 looks up the non-volatile memory 1200 to obtain the test invalid current ranges of ±14 mA and ±15 mA or the test zero current offsets of 8 mA and 7 mA corresponding to the test temperatures of 35° C. and 45° C. In this way, the control circuit 1600 can calculate through interpolation to obtain the present invalid current range Rc of ±14.5 mA or obtain the current zero current offset Sc of 7.5 mA. Then, the electric capacity measurement circuit 1800 compensates the input current signal Ai according to the present invalid current range Rc (i.e., ±14.5 mA) or the present zero current offset Sc (i.e., 7.5 mA) to generate the electric capacity signal Qo.

Referring to FIG. 1, in another embodiment of the invention, the control circuit 1600 can substitute the test temperature values and the test zero current offsets corresponding to the test temperature values into a polynomial regression formula to calculate a plurality of coefficients of the polynomial regression formula to serve as a plurality of first coefficients. Then, the control circuit 1600 can substitute the first coefficients and the present temperature value Tc into the polynomial regression formula to calculate the present zero current offset Sc. Alternatively, the control circuit 1600 can substitute the test temperature values and the test invalid current ranges corresponding to the test temperature values into the polynomial regression formula to calculate the coefficients of the polynomial regression formula to serve as a plurality of second coefficients. Then, the control circuit 1600 can substitute the second coefficients and the present temperature value Tc into the polynomial regression formula to calculate the present invalid current range Rc.

In the present embodiment of the invention, the polynomial regression formula can be a following equation (1), in which $Y_1$ is the present zero current offset Sc, the test zero current offsets, the present invalid current range Rc or the test invalid current ranges, $A_{10}$, $A_{11}$, $A_{12}$, ..., $A_{1n}$ are coefficients, T is the present temperature value Tc or the test temperature values, $E_1$ is an error, which is a constant value, and n is a number of the test temperature values minus 1, which is a positive integer. The equation (1) is as follow:

$$Y_1 = A_{10} + A_{11} \times T + A_{12} \times T^2 + \ldots + A_{1n} \times T^n + E_1 \qquad \text{equation (1)}$$

For example, in the test stage, the zero current offset of the electric capacity measurement circuit 1800 under the test temperate of 25° C. is 5 mA, and the zero current offset under the test temperate of 80° C. is 16 mA, and these test parameters (i.e., 25° C., 5 mA, 80° C., 16 mA) are stored in the non-volatile memory 1200. In the operation stage, the control circuit 1600 can read the test parameters (i.e., 25° C., 5 mA, 80° C., 16 mA) in the non-volatile memory 1200 and substitute the same into the equation (1) to obtain following equations (2) and (3), in which the error $E_1$ is assumed to be 0. Since the number of the test temperature values (i.e., 25° C., 80° C.) is 2, n is 1.

$$5 = A_{10} + 25 A_{11} \qquad \text{equation (2)}$$

$$16 = A_{10} + 80 A_{11} \qquad \text{equation (3)}$$

By solving simultaneous equations according to the equations (2) and (3), it is obtained that the coefficient $A_{11}$ (i.e., the first coefficient) is 0.2, and the coefficient $A_{10}$ (i.e., the first coefficient) is 0. When the temperature measurement circuit 1400 measures that the present temperature value Tc is 45° C., the control circuit 1600 can substitute the coefficient $A_{11}$ (i.e., the first coefficient of 0.2), the coefficient $A_{10}$ (i.e., the first coefficient of 0) and the present temperature value Tc (i.e., T is 45) into the equation (1) to obtain the present zero current offset Sc (i.e., $Y_1$) of 9 mA. In the present embodiment, when the temperature of the electric capacity measurement circuit 1800 is increased from 25° C. to 45° C., if the present zero current offset Sc of the electric capacity measurement circuit 1800 cannot be accordingly adjusted, the present zero current offset Sc of the electric capacity measurement circuit 1800 may have an error of 44.4% (i.e., (|9−5|)÷9×100%).

Similarly, in the test stage, the invalid current range of the electric capacity measurement circuit 1800 under the test temperate of 25° C. is ±10 mA, and the invalid current range under the test temperate of 80° C. is ±21 mA, and these test parameters (i.e., 25° C., ±10 mA, 80° C., ±21 mA) are stored in the non-volatile memory 1200. In the operation stage, the control circuit 1600 can read the test parameters (i.e., 25° C., ±10 mA, 80° C., ±21 mA) in the non-volatile memory 1200 and substitute the same into the equation (1) to obtain following equations (4) and (5), in which the error $E_1$ is assumed to be 0. Since the number of the test temperature values (i.e., 25° C., 80° C.) is 2, n is 1.

$$10 = A_{10} + 25 A_{11} \qquad \text{equation (4)}$$

$$21 = A_{10} + 80 A_{11} \qquad \text{equation (5)}$$

By solving simultaneous equations according to the equations (4) and (5), it is obtained that the coefficient $A_{11}$ (i.e., the second coefficient) is 0.2, and the coefficient $A_{10}$ (i.e., the second coefficient) is 5. When the temperature measurement circuit 1400 measures that the present temperature value Tc is 45° C., the control circuit 1600 can substitute the coefficient $A_{11}$ (i.e., the second coefficient of 0.2), the coefficient $A_{10}$ (i.e., the second coefficient of 5) and the present temperature value Tc (i.e., T is 45) into the equation (1) to obtain the present invalid current range Rc (i.e., $Y_1$) of ±14 mA. In the present embodiment, when the temperature of the electric capacity measurement circuit 1800 is increased from 25° C. to 45° C., if the present invalid current range Rc of the electric capacity measurement circuit 1800 cannot be accordingly adjusted, the present invalid current range Rc of the electric capacity measurement circuit 1800 may have an error of 28.5% (i.e., (|14−10|)÷14×100%).

In the present embodiment of the invention, the number of the test temperature values (i.e., 25° C., 80° C.) is two, though the invention is not limited thereto. In other embodiments, the number of the test temperatures can be greater than two. In description of a following embodiment, the number of the test temperature values is 3, and the embodiments with other number of the test temperature values can be deduced by analogy.

In the test stage, it is assumed that the invalid current ranges of the electric capacity measurement circuit 1800 under test temperatures of 25° C., 50° C. and 75° C. are respectively ±10 mA, ±18 mA and ±22 mA, and zero current offsets thereof are respectively 5 mA, 9 mA and 17 mA. In this way, these test parameters (i.e., 25° C., ±10 mA, 5 mA, 50° C., ±18 mA, 9 mA, 75° C., ±22 mA, 17 mA) are stored in the non-volatile memory 1200. In the operation stage, the control circuit 1600 reads the test parameters (i.e., 25° C., ±10 mA, 5 mA, 50° C., ±18 mA, 9 mA, 75° C., ±22 mA, 17 mA) stored in the non-volatile memory 1200, and substitutes the same into the equation (1) to respectively obtain following equations (6), (7), (8) and equations (9), (10), (11), in which the error $E_1$ is assumed to be 0. Since the number of the test temperature values (i.e., 25° C., 50° C., 75° C.) is 3, n is 2.

$$5 = A_{10} + 25A_{11} + 25^2 A_{12} \quad \text{equation (6)}$$

$$9 = A_{10} + 50A_{11} + 50^2 A_{12} \quad \text{equation (7)}$$

$$17 = A_{10} + 75A_{11} + 75^2 A_{12} \quad \text{equation (8)}$$

$$10 = A_{10} + 25A_{11} + 25^2 A_{12} \quad \text{equation (9)}$$

$$18 = A_{10} + 50A_{11} + 50^2 A_{12} \quad \text{equation (10)}$$

$$22 = A_{10} + 75A_{11} + 75^2 A_{12} \quad \text{equation (11)}$$

Similarly, by solving simultaneous equations according to the equations (6), (7), (8), coefficient $A_{10}$, $A_{11}$, and $A_{12}$ (i.e., the first coefficients) are obtained, and by solving simultaneous equations according to the equations (9), (10), (11), the coefficient $A_{10}$, $A_{11}$, and $A_{12}$ (i.e., the second coefficients) are obtained. In the operation stage, when the temperature measurement circuit 1400 measures that the present temperature value Tc is 45° C., the control circuit 1600 can substitute the obtained first coefficients and the present temperature value Tc (i.e., T is 45) into the equation (1) to obtain the present zero current offset (i.e., $Y_1$) of 7.9 mA. Similarly, the control circuit 1600 can substitute the obtained second coefficients and the present temperature value Tc (i.e., T is 45) into the equation (1) to obtain the present invalid current range Rc (i.e., $Y_1$) of ±16.7 mA. In the present embodiment, when the temperature of the electric capacity measurement circuit 1800 is increased from 25° C. to 45° C., if the present zero current offset Sc or the present invalid current range Rc of the electric capacity measurement circuit 1800 cannot be accordingly adjusted, the present zero current offset Sc and the present invalid current range Rc of the electric capacity measurement circuit 1800 may respectively have errors of 36.7% and 40.1%.

Referring to FIG. 1, in another embodiment of the invention, the control circuit 1600 can calculate the present zero current offset Sc according to the present temperature value Tc, a part of test temperature values and a part of test zero current offsets. Alternatively, the control circuit 1600 can calculate the present invalid current range Rc according to the present temperature value Tc, a part of test temperature values and a part of test invalid current ranges.

For example, it is assumed that the number of the test temperature values stored in the non-volatile memory 1200 is 10. When the temperature of the electric capacity measurement circuit 1800 is increased from 25° C. to 45° C., the control circuit 1600 can read m test temperature values stored in the non-volatile memory 1200 and the corresponding m test zero current offsets only to calculate the present zero current offset Sc. Alternatively, the control circuit 1600 can read m test temperature values stored in the non-volatile memory 1200 and the corresponding m test invalid current ranges only to calculate the present invalid current range Rc, where m is smaller than 10. In following descriptions, m is, for example, equal to 3.

Figure 2A:
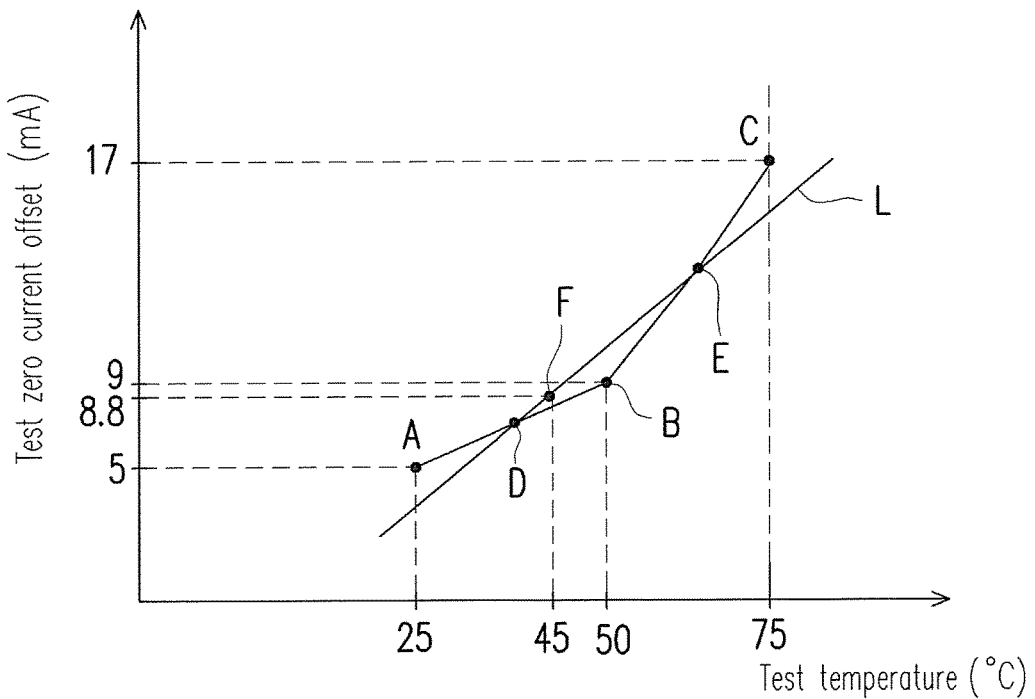
FIG. 2A and FIG. 2B are schematic diagrams of calculating methods of a present zero current offset according to an embodiment of the invention.
Figure 2B:
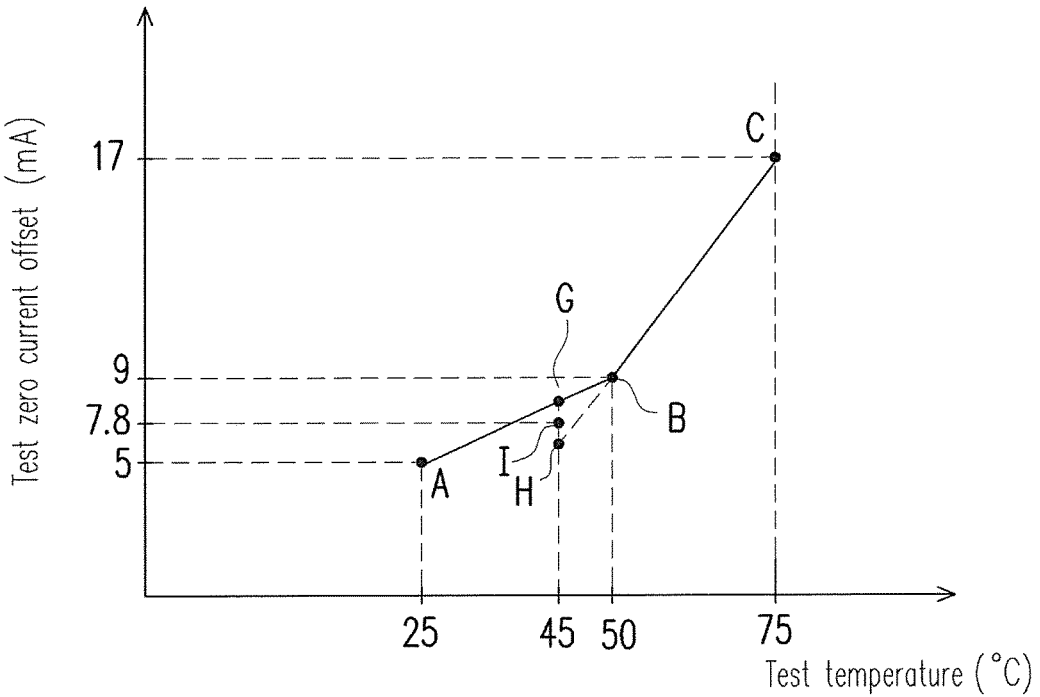

When the temperature of the electric capacity measurement circuit 1800 is changed, the control circuit 1600 can read the test zero current offsets corresponding to the test temperatures 25° C., 50° C. and 75° C. from the non-volatile memory 1200 only to calculate the present zero current offset Sc. Referring to FIG. 1 and FIG. 2A and FIG. 2B, FIG. 2A and FIG. 2B are schematic diagrams of calculating methods of the present zero current offset according to an embodiment of the invention. It is assumed that the test zero current offsets of the electric capacity measurement circuit 1800 under the test temperatures 25° C., 50° C. and 75° C. are respectively 5 mA, 9 mA and 17 mA. The control circuit 1600 can map the test temperature values (i.e., 25° C., 50° C. and 75° C.) and the test zero current offsets (i.e., 5 mA, 9 mA and 17 mA) to a plurality of first reference points of a coordinate plane (for example, three points A, B and C shown in FIG. 2A or FIG. 2B) to form a plurality of first line segments (for example, a line segment AB and a line segment BC shown in FIG. 2A or FIG. 2B), where a slope of the line segment is different to a slop of the line segment BC.

In the embodiment of FIG. 2A, when the temperature of the electric capacity measurement circuit 1800 is increased from 25° C. to 45° C., the control circuit 1600 can respectively calculate center points D and E of the line segments AB and BC, where a temperature value of the point D is 37.5° C., and the corresponding test zero current offset is 7 mA; and a temperature value of the point E is 62.5° C., and the corresponding test zero current offset is 13 mA. Then, the control circuit 1600 calculates a first equation passing through the point D and the point E (i.e., an equation representing a line L). Thereafter, the control circuit 1600 substitute the present temperature value 45° C. into the first equation to calculate the zero current offset under the present temperature 45° C. (i.e., the present zero current offset Sc) to be 8.8 mA (a point F shown in FIG. 2A).

In the embodiment of FIG. 2B, the control circuit 1600 can perform interpolation and extrapolation operations to the first reference points A, B and C according to the present temperature value to obtain an interpolation zero current offset and at least one extrapolation zero current offset. Then, the control circuit 1600 can average the interpolation zero current offset and the at least one extrapolation zero current offset to obtain the present zero current offset Sc. For example, when the temperature of the electric capacity measurement circuit 1800 is increased from 25° C. to 45° C., the control circuit 1600 determines that the present temperature 45° C. is between the test temperatures 25° C. and 50° C., so that the control circuit 1600 can calculate the interpolation zero current offset of the present temperature 45° C. to be 8.2 mA (for example, a point G shown in FIG. 2B) by using the interpolation method. Moreover, the control circuit 1600 determines that the present temperature 45° C. is out of a range between the test temperatures 50° C. and 75° C., so that the control circuit 1600 can calculate the extrapolation zero current offset of the present temperature 45° C. to be 7.4 mA (for example, a point H shown in FIG. 2B) by using an extrapolation method. Then, the control circuit 1600 averages the interpolation zero current offset of 8.2 mA and the extrapolation zero current offset of 7.4 mA corresponding to the present temperature 45° C. to obtain the present zero current offset of 7.8 mA (a point I shown in FIG. 2B).

In the embodiment of FIG. 2A and FIG. 2B, only the present zero current offset is used for description, and calculation of the present invalid current range can be deduced according to related descriptions of FIG. 2A and FIG. 2B, and details thereof are not repeated.

In the aforementioned embodiment of the invention, the test parameters Pt stored in the storage non-volatile memory 1200 include a plurality of test temperature values and a plurality of test zero current offsets corresponding to the test temperature values. Alternatively, the test parameters Pt stored in the storage non-volatile memory 1200 include a plurality of test temperature values and a plurality of test invalid current ranges corresponding to the test temperature values, which is not limited by the invention. In other embodiments of the invention, the test parameters Pt stored in the storage non-volatile memory 1200 may include a plurality of first coefficients or a plurality of second coefficients. In this case, in the operation stage, the control circuit 1600 can substitute the first coefficients and the present temperature value Tc to the polynomial regression formula (i.e., the equation (1)) to calculate the present zero current offset Sc. Alternatively, the control circuit 1600 can substitute the second coefficients and the present temperature value Tc to the polynomial regression formula (i.e., the equation (1)) to calculate the present invalid current range Rc.

The first coefficients are coefficients $A_{10}, A_{11}, A_{12}, \ldots, A_{1n}$ obtained by substituting a plurality of the test temperature values and a plurality of the test zero current offsets corresponding to the test temperature values into the polynomial regression formula (i.e., the equation (1)). The second coefficients are coefficients $A_{10}, A_{11}, A_{12}, \ldots, A_{1n}$ obtained by substituting a plurality of the test temperature values and a plurality of the test invalid current ranges corresponding to the test temperature values into the polynomial regression formula (i.e., the equation (1)).

Further, the control circuit 1600 or the external test platform can substitute a plurality of the test temperature values and a plurality of the test zero current offsets corresponding to the test temperature values into the equation (1) in the test stage to calculate the coefficients $A_{10}, A_{11}, A_{12}, \ldots, A_{1n}$ (i.e., the first coefficients) of the equation (1). Alternatively, the control circuit 1600 or the external test platform can substitute a plurality of the test temperature values and a plurality of the test invalid current ranges corresponding to the test temperature values into the equation (1) in the test stage to calculate the coefficients $A_{10}, A_{11}, A_{12}, \ldots, A_{1n}$ (i.e., the second coefficients) of the equation (1). Then, the control circuit 1600 or the external test platform can store the first coefficients or the second coefficients to the non-volatile memory 1200 to serve as the test parameters Pt. In this way, in the operation stage, when the temperature measurement circuit 1400 detects that the present temperature value Tc is changed, the control circuit 1600 can substitute the present temperature value Tc and the first coefficients stored in the non-volatile memory 1200 into the equation (1) to obtain the present zero current offset Sc. Alternatively, the control circuit 1600 can substitute the present temperature value Tc and the second coefficients stored in the non-volatile memory 1200 into the equation (1) to obtain the present invalid current range Rc.

Figure 3A:
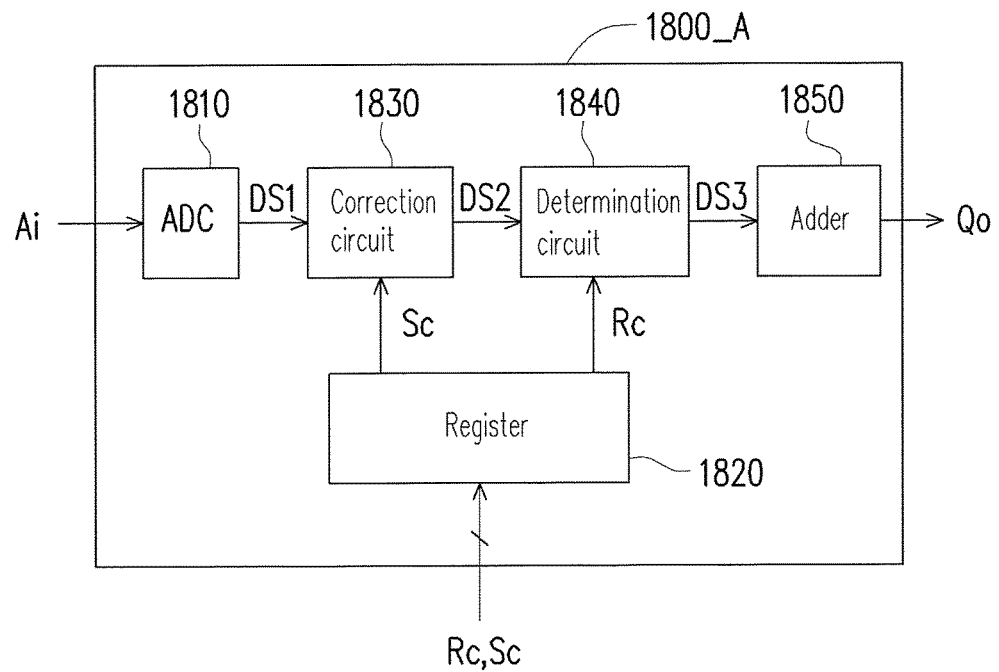
FIG. 3A and FIG. 3B are block schematic diagrams of an electric capacity measurement circuit 1800 shown in FIG. 1.

The electric capacity measurement circuit 1800 is described in detail below. Referring to FIG. 1 and FIG. 3A, FIG. 3A is a block schematic diagram of the electric capacity measurement circuit 1800 shown in FIG. 1. The electric capacity measurement circuit 1800_A of FIG. 3A includes an analog-to-digital converter (ADC) 1810, a register 1820, a correction circuit 1830, a determination circuit 1840 and an adder 1850.

The ADC 1810 receives the input current signal Ai, and converts the input current signal Ai into a first digital signal DS1. The register 1820 receives and stores the present invalid current range Rc and the present zero current offset Sc. It should be noticed that the input current signal Ai can be provided by an external current measurement unit (not shown). The external current measurement unit can measure a current flowing into or flowing out of a target device (for example, a battery) to obtain the input current signal Ai.

The correction circuit 1830 is coupled to the ADC 1810 and the register 1820 to respectively receive the first digital signal DS1 and the present zero current offset Sc. The correction circuit 1830 corrects the first digital signal DS1 according to the present zero current offset Sc to generate a second digital signal DS2.

The determination circuit 1840 is coupled to the correction circuit 1830 and the register 1820, and respectively receives the second digital signal DS2 and the present invalid current range Rc to generate a third digital signal DS3. The determination circuit 1840 determines whether the second digital signal DS2 is within the present invalid current range Rc. If yes, the determination circuit 1840 filters the second digital signal DS2, and otherwise the determination circuit outputs the second digital signal DS2 to serve as the third digital signal DS3.

The adder 1850 is coupled to the determination circuit 1840 to receive the third digital signal DS3, and accumulates the third digital signal DS3 to generate the electric capacity signal Qo.

The operation of the electric capacity measurement circuit 1800_A is described below. It is assumed that the electric capacity measurement circuit 1800_A measures a current magnitude of the input current signal Ai to be 10 mA, and the present zero current offset Sc and the present invalid current range Rc are respectively 4 mA and ±3 mA. Therefore, a current magnitude of the first digital signal DS1 converted by the ADC 1810 is 10 mA. Since the present zero current offset Sc is 4 mA, a current magnitude of the second digital signal DS2 corrected by the correction circuit 1830 is 6 mA (i.e., 10 mA minus 4 mA). Then, the determination circuit 1840 determines that the current magnitude 6 mA of the second digital signal DS2 is not within the present invalid current range Re (i.e., ±3 mA), the determination circuit 1840 outputs the second digital signal DS2 to serve as the third digital signal DS3. Namely, a current magnitude of the third digital signal DS3 is 6 mA. In other words, the electric capacity measurement circuit 1800_A now regards the current magnitude of the input current signal Ai as 6 mA other than 10 mA. In this way, the adder 1850 accumulates the current magnitude 6 mA of the third digital signal DS3 to generate the electric capacity signal Qo.

Figure 3B:
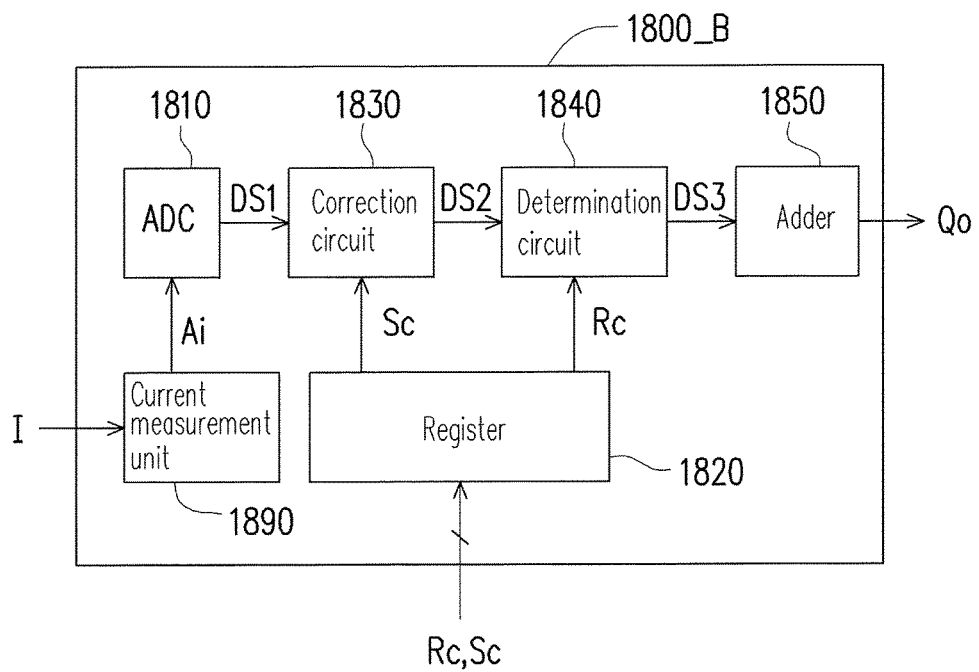

In an embodiment of the invention, the external current measurement unit can also be integrated into the electric capacity measurement circuit. Referring to FIG. 1 and FIG. 3B, FIG. 3B is a block schematic diagram of the electric capacity measurement circuit 1800 shown in FIG. 1. The electric capacity measurement circuit 1800_B of FIG. 3B is similar to the electric capacity measurement circuit 1800_A of FIG. 3A. Compared to the electric capacity measurement circuit 1800_A of FIG. 3A, the electric capacity measurement circuit 1800_B of FIG. 3B further includes a current measurement unit 1890. The current measurement unit 1890 is configured to measure a current flowing into or flowing out of a target device (not shown) to obtain the input current signal Ai. The current measurement unit 1890 provides the obtained input current signal Ai to the ADC 1810 for subsequent processing. Therefore, the operation method of the electric capacity measurement circuit 1800_B of FIG.

3B may refer to related description of the electric capacity measurement circuit 1800_A of FIG. 3A, and detail thereof is not repeated.

Figure 4:
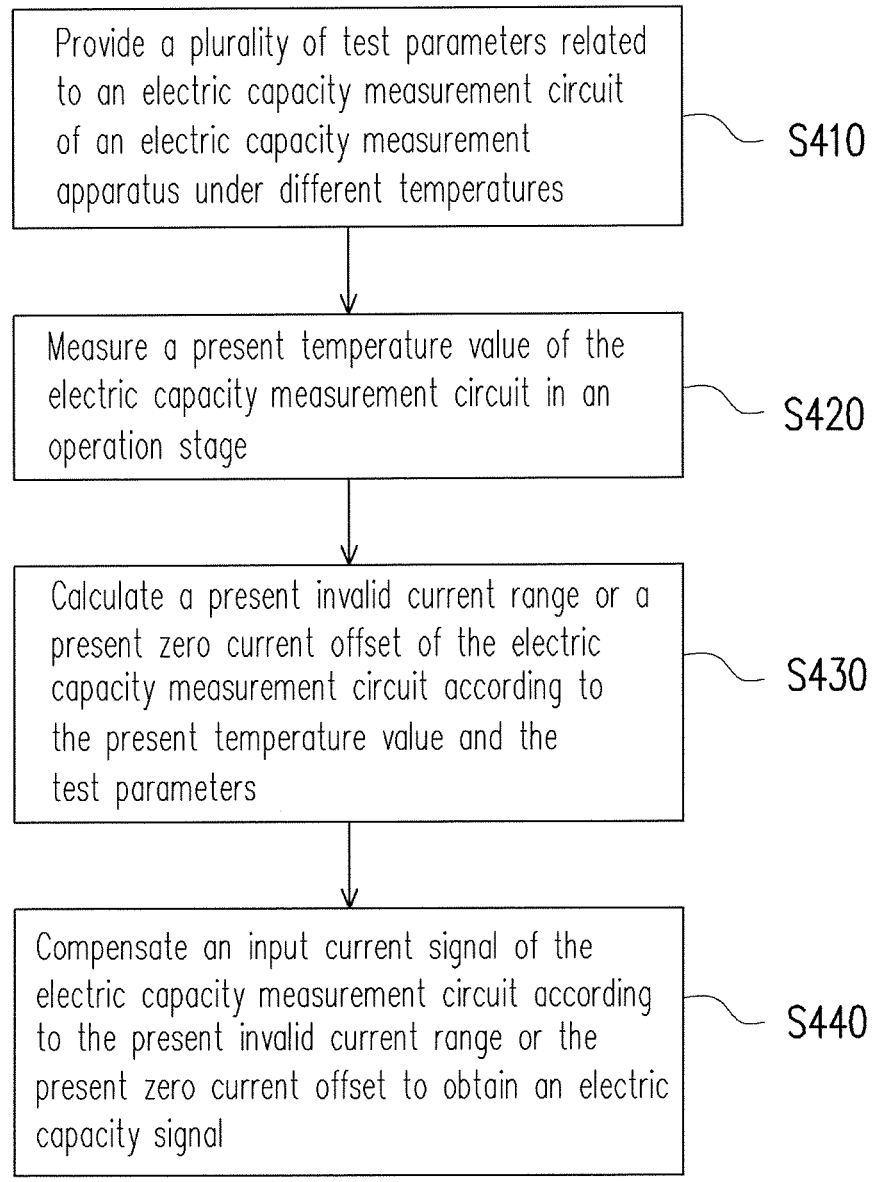
FIG. 4 is a flowchart illustrating a temperature compensation method for an electric capacity measurement apparatus according to an embodiment of the invention.

FIG. 4 is a flowchart illustrating a temperature compensation method for an electric capacity measurement apparatus according to an embodiment of the invention. Referring to FIG. 1 and FIG. 4, temperature compensation method for the electric capacity measurement apparatus of the present exemplary embodiment includes following steps. First, in step S410, a plurality of test parameters Pt related to the electric capacity measurement circuit 1800 of the electric capacity measurement apparatus 1000 under different temperatures are provided. Then, in step S420, the present temperature value Tc of the electric capacity measurement circuit 1800 is measured in the operation stage. Then, in step S430, the present invalid current range Rc or the present zero current offset Sc of the electric capacity measurement circuit 1800 is calculated according to the present temperature value Tc and the test parameters Pt. Finally, in step S440, the input current signal Ai of the electric capacity measurement circuit 1800 is compensated according to the present invalid current range Rc or the present zero current offset Sc to obtain the electric capacity signal Qo.

Moreover, since those skilled in the art can learn enough instructions and recommendations of the temperature compensation method for the electric capacity measurement apparatus from the descriptions of the embodiments of FIG. 1, FIG. 2A, FIG. 2B, FIG. 3A and FIG. 3B, detailed description thereof is not repeated.

In summary, in the embodiments of the invention, the electric capacity measurement apparatus of the invention obtains the invalid current range or the zero current offset under the present temperature according to the test parameters stored in the non-volatile memory by using a table look-up method, a polynomial regression operation or other operation modes. In other words, the present invalid current range or the present zero current offset of the electric capacity measurement circuit can be dynamically adjusted according to a temperature variation. Therefore, the error of the electric capacity measurement circuit of the electric capacity measurement device generated due to the temperature variation is decreased, and the minimum current that can be measured by the electric capacity measurement circuit and a current accuracy thereof are upgraded under different temperatures.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. An electric capacity measurement apparatus with temperature compensation, comprising:
    an electric capacity measurement circuit, configured to obtain an input current signal and compensate the input current signal according to a present invalid current range or a present zero current offset to obtain an electric capacity signal;
    a non-volatile memory, configured to store a plurality of test parameters related to the electric capacity measurement circuit under different temperatures in a test stage;
    a temperature measurement circuit, configured to measure a present temperature of the electric capacity measurement circuit in an operation stage to generate a present temperature value; and
    a control circuit, coupled to the electric capacity measurement circuit, the temperature measurement circuit and the non-volatile memory, and generating the present invalid current range or the present zero current offset according to the present temperature value and the test parameters for providing to the electric capacity measurement circuit.

2. The electric capacity measurement apparatus as claimed in claim 1, wherein the test parameters comprise:
    a plurality of test temperature values; and
    a plurality of test zero current offsets or a plurality of test invalid current ranges corresponding to the test temperature values.

3. The electric capacity measurement apparatus as claimed in claim 2, wherein the control circuit is configured to find the test zero current offset or the test invalid current range corresponding to the present temperature value according to the test parameters to respectively serve as the present zero current offset or the present invalid current range.

4. The electric capacity measurement apparatus as claimed in claim 2, wherein
    the control circuit is configured to substitute the test temperature values and the test zero current offsets corresponding to the test temperature values into a polynomial regression formula to calculate a plurality of coefficients of the polynomial regression formula to serve as a plurality of first coefficients, and substitute the first coefficients and the present temperature value into the polynomial regression formula to calculate the present zero current offset; or
    the control circuit is configured to substitute the test temperature values and the test invalid current ranges corresponding to the test temperature values into the polynomial regression formula to calculate the coefficients of the polynomial regression formula to serve as a plurality of second coefficients, and substitute the second coefficients and the present temperature value into the polynomial regression formula to calculate the present invalid current range.

5. The electric capacity measurement apparatus as claimed in claim 4, wherein
    the polynomial regression formula is $Y_1 = A_{10} + A_{11} \times T + A_{12} \times T^2 + \ldots + A_{1n} \times T^n + E_1$, wherein $Y_1$ is the present zero current offset, the test zero current offsets, the present invalid current range or the test invalid current ranges, $A_{10}, A_{11}, A_{12}, \ldots, A_{1n}$ are the coefficients, T is the present temperature value or the test temperature values, $E_1$ is an error, n is a number of the test temperature values minus 1, and n is a positive integer.

6. The electric capacity measurement apparatus as claimed in claim 2, wherein
    the control circuit is configured to calculate the present zero current offset according to the present temperature value, a part of the test temperature values and a part of the test zero current offsets; or
    the control circuit is configured to calculate the present invalid current range according to the present temperature value, a part of the test temperature values and a part of the test invalid current ranges.

7. The electric capacity measurement apparatus as claimed in claim 6, wherein the control circuit is configured to map the part of the test temperature values and the part of the test zero current offsets to a plurality of first reference points of a coordinate plane to form a plurality of first line segments, the control circuit is configured to calculate a plurality of first center points of the first line segments, the control circuit is configured to calculate a first equation passing through the first center points, and the control circuit is configured to substitute the present temperature value into the first equation to calculate the present zero current offset; or the control circuit is configured to map the part of the test temperature values and the part of the test invalid current ranges to a plurality of second reference points of the coordinate plane to form a plurality of second line segments, the control circuit is configured to calculate a plurality of second center points of the second line segments, the control circuit is configured to calculate a second equation passing through the second center points, and the control circuit is configured to substitute the present temperature value into the second equation to calculate the present invalid current range.

8. The electric capacity measurement apparatus as claimed in claim 6, wherein the control circuit is configured to map the part of the test temperature values and the part of the test zero current offsets to a plurality of first reference points of a coordinate plane, the control circuit is configured to perform an interpolation operation and an extrapolation operation to the first reference points according to the present temperature value to obtain an interpolation zero current offset and at least one extrapolation zero current offset, and the control circuit is configured to perform an average operation to the interpolation zero current offset and the at least one extrapolation zero current offset to obtain the present zero current offset; or the control circuit is configured to map the part of the test temperature values and the part of the test invalid current ranges to a plurality of second reference points of the coordinate plane, the control circuit is configured to perform an interpolation operation and an extrapolation operation to the second reference points according to the present temperature value to obtain an interpolation invalid current range and at least one extrapolation invalid current range, and the control circuit is configured to perform an average operation to the interpolation invalid current range and the at least one extrapolation invalid current range to obtain the present invalid current range.

9. The electric capacity measurement apparatus as claimed in claim 1, wherein the test parameters stored in the non-volatile memory comprise a plurality of first coefficients or a plurality of second coefficients; the control circuit is configured to substitute the first coefficients and the present temperature value into a polynomial regression formula to calculate the present zero current offset, or substitute the second coefficients and the present temperature value into the polynomial regression formula to calculate the present invalid current range.

10. The electric capacity measurement apparatus as claimed in claim 9, wherein the control circuit is configured to substitute a plurality of test temperature values and a plurality of test zero current offsets corresponding to the test temperature values into the polynomial regression formula in the test stage to calculate a plurality of coefficients of the polynomial regression formula to serve as the first coefficients, and store the first coefficients to the non-volatile memory; or the control circuit is configured to substitute the test temperature values and a plurality of test invalid current ranges corresponding to the test temperature values into the polynomial regression formula in the test stage to calculate the coefficients of the polynomial regression formula to serve as the second coefficients, and store the second coefficients to the non-volatile memory.

11. The electric capacity measurement apparatus as claimed in claim 1, wherein the electric capacity measurement circuit comprises:

an analog-to-digital converter, configured to receive the input current signal, and converting the input current signal into a first digital signal;

a register, configured to receive and store the present invalid current range and the present zero current offset;

a correction circuit, coupled to the analog-to-digital converter and the register to respectively receive the first digital signal and the present zero current offset, and configured to correct the first digital signal according to the present zero current offset to generate a second digital signal;

a determination circuit, coupled to the correction circuit and the register to respectively receive the second digital signal and the present invalid current range to generate a third digital signal, wherein the determination circuit is configured to determine whether the second digital signal is within the present invalid current range, and if yes, the determination circuit filters the second digital signal, and otherwise outputs the second digital signal to serve as the third digital signal; and an adder, coupled to the determination circuit to receive the third digital signal, and accumulating the third digital signal to generate the electric capacity signal.

12. The electric capacity measurement apparatus as claimed in claim 11, wherein the electric capacity measurement circuit further comprises:

a current measurement unit, configured to measure a current flowing into or flowing out of a target device to obtain the input current signal.

13. A temperature compensation method of an electric capacity measurement apparatus, comprising:

providing a plurality of test parameters related to an electric capacity measurement circuit of the electric capacity measurement apparatus under different temperatures;

measuring a present temperature value of the electric capacity measurement circuit in an operation stage;

calculating a present invalid current range or a present zero current offset of the electric capacity measurement circuit by a control circuit according to the present temperature value and the test parameters; and compensating an input current signal of the electric capacity measurement circuit according to the present invalid current range or the present zero current offset to obtain an electric capacity signal.

14. The temperature compensation method of the electric capacity measurement apparatus as claimed in claim 13, wherein the test parameters comprise:

a plurality of test temperature values; and
a plurality of test zero current offsets or a plurality of test invalid current ranges corresponding to the test temperature values.

15. The temperature compensation method of the electric capacity measurement apparatus as claimed in claim 14, wherein the step of calculating the present invalid current range or the present zero current offset of the electric capacity measurement circuit according to the present temperature value and the test parameters comprises:
finding the test zero current offset or the test invalid current range corresponding to the present temperature value according to the test parameters to respectively serve as the present zero current offset or the present invalid current range.

16. The temperature compensation method of the electric capacity measurement apparatus as claimed in claim 14, wherein the step of calculating the present invalid current range or the present zero current offset of the electric capacity measurement circuit according to the present temperature value and the test parameters comprises:
substituting the test temperature values and the test zero current offsets corresponding to the test temperature values into a polynomial regression formula to calculate a plurality of coefficients of the polynomial regression formula to serve as a plurality of first coefficients, and substituting the first coefficients and the present temperature value into the polynomial regression formula to calculate the present zero current offset; or
substituting the test temperature values and the test invalid current ranges corresponding to the test temperature values into the polynomial regression formula to calculate the coefficients of the polynomial regression formula to serve as a plurality of second coefficients, and substituting the second coefficients and the present temperature value into the polynomial regression formula to calculate the present invalid current range.

17. The temperature compensation method of the electric capacity measurement apparatus as claimed in claim 16, wherein the polynomial regression formula is $Y_1 = A_{10} + A_{11} \times T + A_{12} \times T^2 + \ldots + A_{1n} \times T^n + E_1$, wherein $Y_1$ is the present zero current offset, the test zero current offsets, the present invalid current range or the test invalid current ranges, $A_{10}$, $A_{11}$, $A_{12}$, $\ldots$, $A_{1n}$ are the coefficients, T is the present temperature value or the test temperature values, $E_1$ is an error, n is a number of the test temperature values minus 1, and n is a positive integer.

18. The temperature compensation method of the electric capacity measurement apparatus as claimed in claim 14, wherein the step of calculating the present invalid current range or the present zero current offset of the electric capacity measurement circuit according to the present temperature value and the test parameters comprises:
calculating the present zero current offset according to the present temperature value, a part of the test temperature values and a part of the test zero current offsets; or
calculating the present invalid current range according to the present temperature value, a part of the test temperature values and a part of the test invalid current ranges.

19. The temperature compensation method of the electric capacity measurement apparatus as claimed in claim 18, wherein the step of calculating the present zero current offset comprises:
mapping the part of the test temperature values and the part of the test zero current offsets to a plurality of first reference points of a coordinate plane, connecting the first reference points to form a plurality of first line segments, calculating a plurality of first center points of the first line segments, calculating a first equation passing through the first center points, and substituting the present temperature value into the first equation to calculate the present zero current offset;
wherein the step of calculating the present invalid current range comprises:
mapping the part of the test temperature values and the part of the test invalid current ranges to a plurality of second reference points of the coordinate plane, connecting the second reference points to form a plurality of second line segments, calculating a plurality of second center points of the second line segments, calculating a second equation passing through the second center points, and substituting the present temperature value into the second equation to calculate the present invalid current range.

20. The temperature compensation method of the electric capacity measurement apparatus as claimed in claim 18, wherein the step of calculating the present zero current offset comprises:
mapping the part of the test temperature values and the part of the test zero current offsets to a plurality of first reference points of a coordinate plane, performing an interpolation operation and an extrapolation operation to the first reference points according to the present temperature value to obtain an interpolation zero current offset and at least one extrapolation zero current offset, and performing an average operation to the interpolation zero current offset and the at least one extrapolation zero current offset to obtain the present zero current offset;
wherein the step of calculating the present invalid current range comprises:
mapping the part of the test temperature values and the part of the test invalid current ranges to a plurality of second reference points of the coordinate plane, performing an interpolation operation and an extrapolation operation to the second reference points according to the present temperature value to obtain an interpolation invalid current range and at least one extrapolation invalid current range, and performing an average operation to the interpolation invalid current range and the at least one extrapolation invalid current range to obtain the present invalid current range.

21. The temperature compensation method of the electric capacity measurement apparatus as claimed in claim 13, wherein the test parameters comprise a plurality of first coefficients or a plurality of second coefficients,
the step of calculating the present zero current offset comprises:
substituting the first coefficients and the present temperature value to a polynomial regression formula to calculate the present zero current offset;
wherein the step of calculating the present invalid current range comprises:
substituting the second coefficients and the present temperature value to the polynomial regression formula to calculate the present invalid current range.

22. The temperature compensation method of the electric capacity measurement apparatus as claimed in claim 21, further comprising:
substituting a plurality of test temperature values and a plurality of test zero current offsets corresponding to the test temperature values into the polynomial regression formula to obtain a plurality of coefficients of the polynomial regression formula to serve as the first coefficients, or substituting the test temperature values and a plurality of test invalid current ranges corresponding to the test temperature values into the polynomial regression formula to obtain the coefficients of the polynomial regression formula to serve as the second coefficients.

23. The temperature compensation method of the electric capacity measurement apparatus as claimed in claim 13, wherein the step of compensating the input current signal of the electric capacity measurement circuit according to the present invalid current range or the present zero current offset to obtain the electric capacity signal comprises:

performing an analog-to-digital conversion to the input current signal to obtain a first digital signal;

correcting the first digital signal according to the present zero current offset to generate a second digital signal;

determining whether the second digital signal is within the present invalid current range, filtering the second digital signal when the second digital signal is within the present invalid current range, and otherwise outputting the second digital signal to serve as a third digital signal; and accumulating the third digital signal to generate the electric capacity signal.

24. The temperature compensation method of the electric capacity measurement apparatus as claimed in claim 23, wherein the step of compensating the input current signal of the electric capacity measurement circuit according to the present invalid current range or the present zero current offset to obtain the electric capacity signal comprises:

measuring a current flowing into or flowing out of a target device to obtain the input current signal.

* * * * *